United States Patent
Immer et al.

(10) Patent No.: US 10,317,198 B2
(45) Date of Patent: Jun. 11, 2019

(54) THREE-DIMENSIONAL MAPPING OF A WAFER

(71) Applicant: KLA-Tencor Corporation, Milpitas, CA (US)

(72) Inventors: Vincent Sebastian Immer, Zikron Yaakov (IL); Naomi Ittah, Ramat Gan (IL); Tal Marciano, Yokneam (IL)

(73) Assignee: KLA-Tencor Corporation, Milpitas, CA (US)

(*) Notice: Subject to any disclaimer, the term of this patent is extended or adjusted under 35 U.S.C. 154(b) by 147 days.

(21) Appl. No.: 15/281,175

(22) Filed: Sep. 30, 2016

(65) Prior Publication Data
US 2018/0245910 A1 Aug. 30, 2018

(51) Int. Cl.
G01B 11/24 (2006.01)
H01L 21/66 (2006.01)
G01B 11/22 (2006.01)
G03F 7/20 (2006.01)

(52) U.S. Cl.
CPC ............. *G01B 11/24* (2013.01); *G01B 11/22* (2013.01); *G03F 7/70633* (2013.01); *H01L 22/12* (2013.01)

(58) Field of Classification Search
CPC ............ G03F 7/70633; G03F 7/70341; G03F 7/7065; G03F 9/7034; G03F 9/7026; G03F 7/70641; G03F 7/70625; G03F 7/7085; G01N 21/8806; G01N 21/956; G01N 2021/95615; G01N 21/47; G02B 7/28; G01B 11/0608
USPC .............................. 356/601; 250/492.1, 492.2
See application file for complete search history.

(56) References Cited

U.S. PATENT DOCUMENTS

| 7,262,138 B1* | 8/2007 | Singh ................. H01L 21/0276 257/E21.029 |
| 2010/0189372 A1* | 7/2010 | Chen ...................... G01B 11/25 382/260 |
| 2011/0261339 A1 | 10/2011 | Van Boxmeer et al. |
| 2014/0111791 A1* | 4/2014 | Manassen .......... G01B 9/02027 356/51 |
| 2016/0011523 A1 | 1/2016 | Singh et al. |

(Continued)

FOREIGN PATENT DOCUMENTS

| JP | 4792833 B2 | 10/2011 |
| KR | 20160014471 A | 2/2016 |

OTHER PUBLICATIONS

ISA/KR, International Search Report and Written Opinion for PCT/US2017/054264 dated Jan. 11, 2018.

(Continued)

*Primary Examiner* — Sunghee Y Gray
(74) *Attorney, Agent, or Firm* — Hodgson Russ LLP

(57) ABSTRACT

Methods and scatterometry overlay metrology tools are provided, which scan a wafer region, perform focus measurements during the scanning to extract therefrom phase information, and derive depth data of the scanned wafer region from the extracted phase information. The depth information, relating to a dimension perpendicular to the wafer, may be derived along lines or surfaces, providing profilometry and surface data, respectively. The depth data may be used to locate metrology targets, as well as to provide material properties concerning wafer layers, to estimate process variation and to improve the overlay measurements.

19 Claims, 5 Drawing Sheets

(56) References Cited

U.S. PATENT DOCUMENTS

2016/0282731 A1    9/2016  Pandev
2017/0176177 A1*  6/2017  Takesue ................ G01B 11/24
2018/0195855 A1*  7/2018  Liu .................... G01B 11/0675

OTHER PUBLICATIONS

Kocher, Automated Focault test for focus sensing, Applied Optics, vol. 22, No. 12, pp. 1887-1892 Jun. 15, 1983.

* cited by examiner

THREE-DIMENSIONAL MAPPING OF A WAFER

BACKGROUND OF THE INVENTION

1. Technical Field

The present invention relates to the field of metrology, and more particularly, to scatterometry overlay metrology.

2. Discussion of Related Art

Scatterometry overlay metrology tools use focus measurements to determine the degree of focus on the metrology targets on which overlay data is measured.

Kocher 1983 (Automated Foucault test for focus sensing, Applied Optics 22(12): 1887-1892) teaches focus measurements using a chopper wheel, a bicell photodetector, and an electronic phase detector to obtain a linear focus error voltage for an isolated point image, also known as knife edge focusing due to their utilization of the dependency of the direction of the knife-edge shadow motion (e.g., chopper wheel member) on the axial position of the edge relative to the focus.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising: scanning a wafer region by a metrology tool, performing focus measurements by the metrology tool during the scanning and extracting therefrom phase information, and deriving depth data of the scanned wafer region from the extracted phase information.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
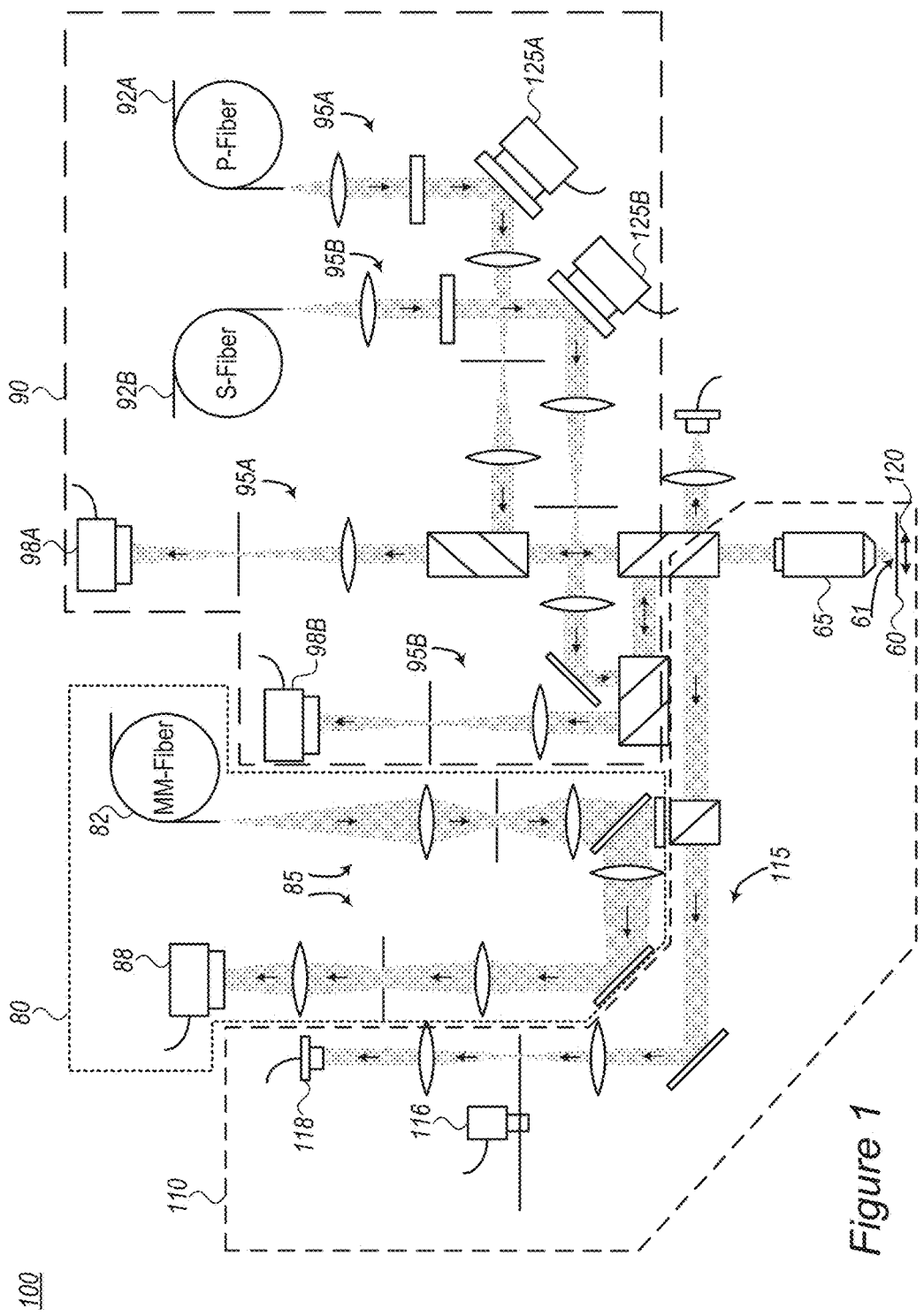
FIG. 1 is a high level schematic illustration of a metrology tool, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Methods and scatterometry overlay metrology tools are provided, which scan a wafer region, perform focus measurements during the scanning (e.g., using the knife edge method based on the Foucault test as taught by Kocher 1983) to extract therefrom phase information, and derive depth data of the scanned wafer region from the extracted phase information. The depth information, relating to a dimension perpendicular to the wafer, may be derived along lines or surfaces, providing profilometry and surface data, respectively. The depth data may be used to locate metrology targets, as well as to provide material properties concerning wafer layers, to estimate process variation and to improve the overlay measurements.

FIG. 1 is a high level schematic illustration of a metrology tool 100, according to some embodiments of the invention. Metrology tool 100 comprises, schematically, an overlay measurement part 90, a wafer imaging part 80 and a focus measurement part 110. Overlay measurement part 90 may be implemented using polarized illumination sources 92A, 92B (e.g., S- and P- polarized optical fibers, with S- and P- denoting different, e.g., orthogonal, polarization states) and corresponding detectors 98A, 98B, with optical paths 95A, 95B that include optical elements for controlling the respective beams, directing the illumination via an objective 65 onto a wafer region 61 on a wafer 60, and delivering collected scattered radiation to corresponding detectors 98A, 98B via the optical elements. The optical elements, which comprise e.g., corresponding apodizers, aperture and field stops, lenses and beam splitters (polarizing beam splitters where polarized radiation is handled), are arranged to control and optimize the respective beams along optical paths 95A, 95B. Wafer imaging part 80 utilizes non-polarized illumination, e.g., by a multimode (MM) optical fiber 82, for imaging a wafer region 61 on a camera 88 such as a CCD (charge coupled detector) via an optical path 85 with optical elements configured to control the corresponding illumination and collection beams directed via objective 65 to wafer region 61.

Focus measurement part 110 uses the illumination from overlay measurement part 90 (e.g., laser polarized illumination) and/or from wafer imaging part 80 (e.g., non-polarized white light illumination), which is guided via a separate optical path 115, to derive a focus signal relating to the degree of focus of wafer region 61. Focus measurement part 110 typically comprises a chopper 116 at field plane and a focus detector 118 such as a bi-cell which measures the reflected illumination from wafer 60 which passes through chopper 116. When a laser beam (e.g., from any of illumination sources 82, 92A, 92B) hits wafer 60, part of the reflected light is collected through focus channel 110, modulated by chopper 116 and is collected by detector 118 (e.g., bi-cell with two photodiodes). The focus signal provides the phase between the signals of the two photodiode and is used to measure the vertical position of wafer 60 in relation to objective 65, due to its nearly linear relationship therewith.

Figure 2:
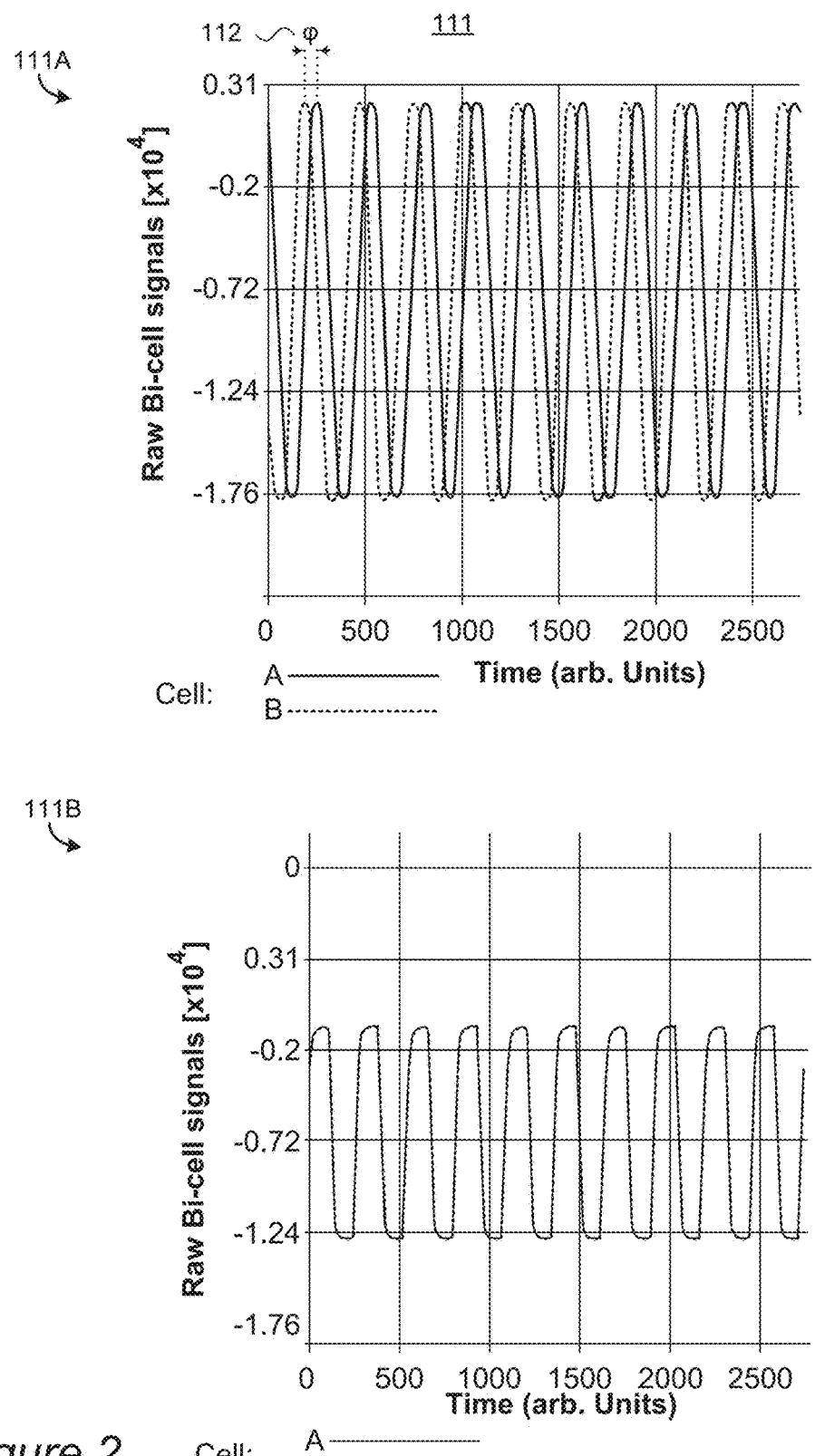
FIG. 2 is an exemplary schematic illustration of focus signals and the linearity of its phase on calibration curve, according to some embodiments of the invention.
Figure 2:
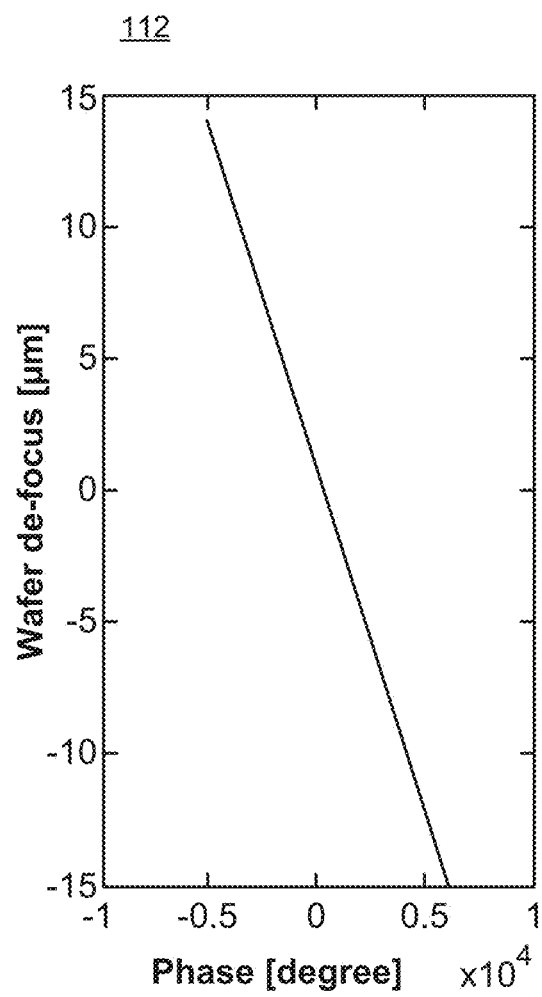

FIG. 2 is an exemplary schematic illustration of focus signals 111 and the linearity of its phase on calibration curve 112, according to some embodiments of the invention. Signal 111A illustrates a case in which wafer region 61 is out of focus, resulting in a phase 112 (marked φ) between the signals measured by the cells (marked A and B); while signal 111B illustrates a case in which wafer region 61 is in focus, resulting in a zero phase between the signals measured by the cells (which therefore overlap). The dependency of the degree of de-focus on phase 112 is shown to be linear, at least in the region of φ=0 (in-focus). Phase curve 112 or similar curves, may be used to calibrate the distance of wafer region 61 (i.e., the wafer de-focus) from objective 65, according to measured phase (depending on wavelength and apodizer, the illustrated non-limiting example is for wavelength of 685 nm and a 0.2 top hat apodizer).

Focus measurement part 110 may be configured to provide two or three dimensional measurements of the surface of a certain wafer region, which provide information concerning the vertical dimension (perpendicular to the wafer plane) as well. For this purpose, metrology tool is configured to (i) enable scanning wafer region 61 (possibly including one or more metrology target cells), (ii) perform focus measurements by focus measurement part 110 during the scanning and extracting phase information therefrom (as exemplified in FIG. 2), and (iii) derive depth data (i.e., topographic information, such as 2D profilometry data and/or 3D surface data, relating to a vertical direction, perpendicular to the wafer region) of the scanned wafer region from the extracted phase information.

Metrology tool may be further configured to derive material properties of wafer region 61 from the extracted phase information, such as data concerning the refractive index of wafer region 61, or ratios of segmentation of wafer region 61.

The scanning of wafer region 61 may be carried out by moving a stage (illustrated schematically in FIG. 1 by double-headed arrow 120) that supports wafer 60. Stage movements 120 may be horizontal, in a plane parallel to wafer 60. Alternatively or complementarily, the scanning of wafer region 61 may be carried out using scan mirrors 125A, 125B (see FIG. 1, and/or scan mirrors 125 in FIG. 4) of overlay measurement part 90 in metrology tool 100. In particular, the focus measurements may be carried with non-polarized and/or with polarized illumination from MM fiber 82 and/or single mode fiber(s) (e.g., S- and/or P- fibers 92A, 92B), respectively.

Metrology tool 100 may be configured, e.g., via a metrology module, to utilize the derived depth data (i.e., topographic information, or surface mapping) for any of: (i) locating metrology targets in wafer region 61, e.g., using signal edges, possibly avoiding the current need to grab additional images, and particularly in low accuracy cases such as dark wafer region 61; (ii) estimate process variation in wafer region 61, e.g., process variation in term of thickness, refractive index, segmentation ratio; and (iii) improve overlay measurements by the metrology tool, e.g., by obtaining better overlay correctables, possibly by including corrections for process variation, and possibly all across wafer 60 in consecutive measurements.

In certain embodiments, a laser beam may be scanned across the wafer surface while focus signal 111 (e.g., the bi-cell signal) is recorded in order to calculate the phase signal and from it the distance signal. The laser scanning may be carried out in one direction to obtain (2D) profilometry information, and/or the laser scanning may be carried out in two directions to obtain (3D) surface information. The scanning may be realized with the help of the machine stage (120) and/or by scanning mirrors (125A, 125B). Calibration curve 112 (see example in FIG. 2) may be used to relate the phase of focus signal 111 to the vertical distance between wafer region 61 and objective 65 (depending on wavelength and apodizer). Focus signal 111 and depth data may be used to derive various material properties of wafer region 61 such as layer thickness, refractive index and segmentation ratio (part of developed photoresist in relation of non-developed photoresist), as well as any other property which influences the effective thickness signal.

Figure 3:
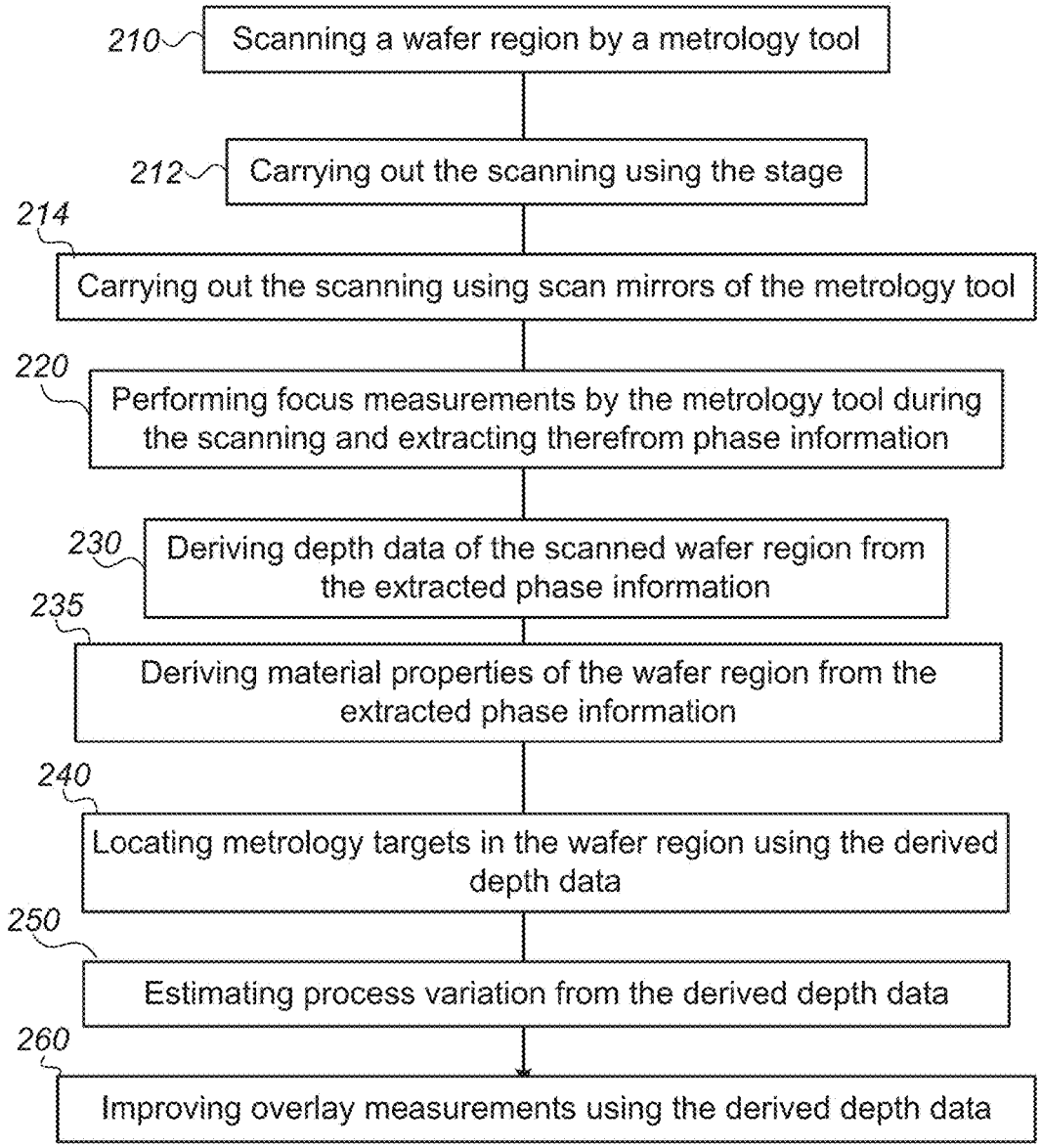
FIG. 3 is a high level flowchart illustrating a method, according to some embodiments of the invention.

FIG. 3 is a high level flowchart illustrating a method 200, according to some embodiments of the invention. The method stages may be carried out with respect by metrology tool 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out of the relevant stages of method 200. Certain embodiments comprise target design files of respective targets designed by embodiments of method 200.

Method 200 comprises scanning a wafer region (possibly including one or more metrology target cells) by a metrology tool (stage 210), performing focus measurements by the metrology tool during the scanning and extracting therefrom phase information (stage 220), and deriving depth data (i.e., topographic information such as 2D profilometry data and/or 3D surface data, relating to a vertical direction, perpendicular to the wafer region) of the scanned wafer region from the extracted phase information (stage 230).

Method 200 may further comprise deriving material properties of the wafer region from the extracted phase information (stage 235), such as data concerning the refractive index of the wafer region.

Scanning 210 may be carried out by moving a stage that supports the wafer (stage 212). Stage movements 120 may be horizontal, in a plane parallel to wafer 60. Scanning 210 may be carried out using scan mirrors of the metrology tool (stage 214).

Method 200 may further comprise any of: locating metrology targets in the wafer region using the derived depth data (stage 240), estimating process variation in the wafer region from the derived depth data (stage 250), and improving overlay measurements by the metrology tool, using the derived depth data (stage 260).

Figure 4:
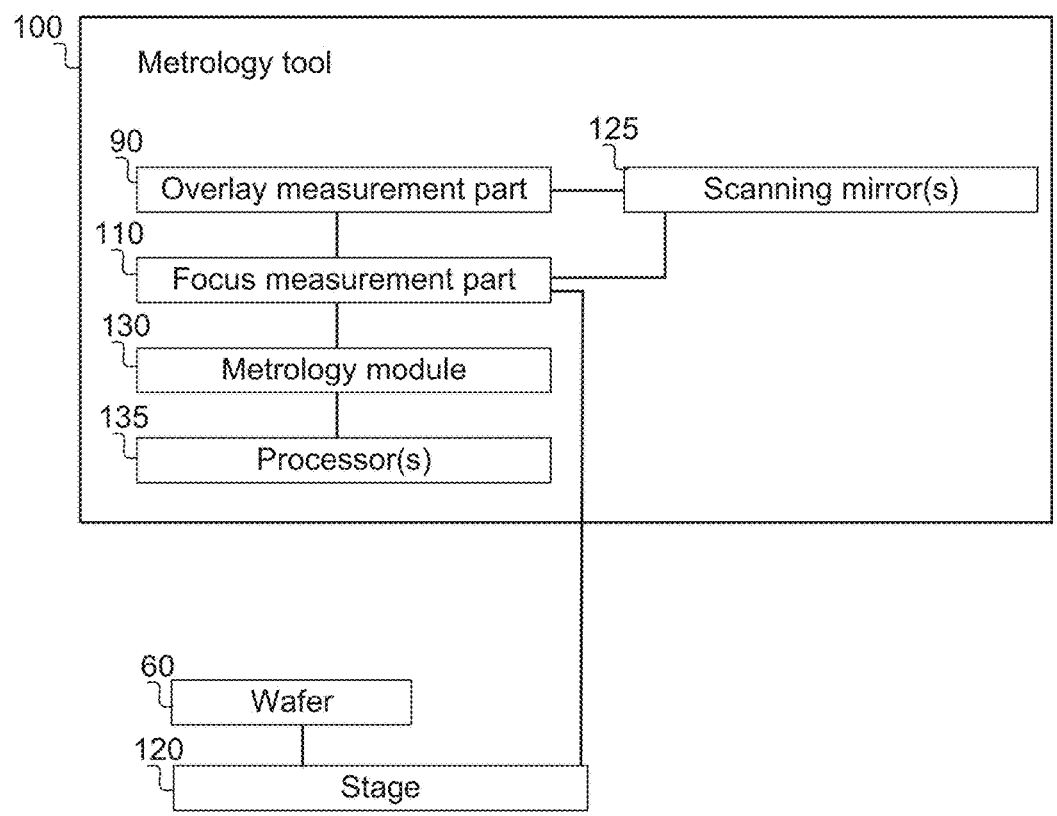
FIG. 4 is a high level schematic block diagram of scatterometry overlay metrology tools, according to some embodiments of the invention.

FIG. 4 is a high level schematic block diagram of scatterometry overlay metrology tool 100, according to some embodiments of the invention. Elements from FIGS. 1 and 4 may combined to provide embodiments of the invention. Scatterometry overlay metrology tool 100, comprising at least overlay measurement part 90 and focus measurement part 110, may be configured to scan wafer region 61 and/or wafer 60, performing focus measurements during the scanning and extract phase information from the focus measurements (e.g., by focus measurement part 110), and derive depth data of the scanned wafer region from the extracted phase information, e.g., by a metrology module 130 associated with at least one computer processor 135.

The scanning may be carried out by moving stage 120 supporting wafer 60 (e.g., horizontally, parallel to wafer 60) and/or using scan mirrors 125 and the depth data may be two or three dimensional—providing profilometry and/or surface information, respectively.

Metrology module 130 may be further configured to derive material properties of wafer region 61 from the extracted phase information, such as layer thickness of one or more layer, refractive indices of one or more layer, segmentation ratios in one or more layers, etc. Metrology module 130 may be configured to use the derived depth data to locate metrology targets on wafer 60, estimate process variation in wafer 60 and/or improve overlay measurements.

Certain embodiments comprise a computer program product comprising a non-transitory computer readable storage medium having computer readable program embodied therewith (and be possible run be processor(s) 135), the computer readable program configured to derive depth data of a scanned wafer region from phase information extracted from focus measurements, wherein the derived depth data is with respect to at least a vertical direction, perpendicular to the wafer region. The computer readable program may be further configured to derive material properties of the wafer region from the extracted phase information, the derived material properties being related to at least one of a refractive index and a segmentation ratio, of at least one wafer layer. The computer readable program may be further configured to provide from the derived depth data 2D profilometry information and/or 3D surface information. The computer readable program may be further configured to locate metrology targets in the wafer region using the derived depth data. The computer readable program may be further configured to estimate process variation in the wafer region from the derived depth data. The computer program product may be integrated in metrology module 130 of scatterometry overlay metrology tool 100 and the computer readable program may be further configured to improve overlay measurements by metrology tool 100, using the derived depth data. Certain embodiments comprise scatterometry overlay metrology tool 100 comprising the computer program product.

Advantageously, disclosed metrology tools 100 and methods 200 implement focus measurements for measuring wafer topography with scatterometry overlay metrology tools, thus simplifying wafer topography measurements on one hand, in particular making it less time consuming with respect e.g., to Linnik interferometers and imaging tools (which use white light interferometry), while, on the other hand, improving scatterometry overlay measurements and/or enhancing target and/or wafer positioning.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
scanning a wafer region with light using a metrology tool, directing light reflected from the wafer region through a chopper onto a focus detector,
performing focus measurements on the light reflected from the wafer region that is received by the focus detector during the scanning such that a degree of focus of the wafer region is determined, and whereby two focus signals are formed,
extracting phase information from the two focus signals, and
deriving depth data of the scanned wafer region from the extracted phase information.

2. The method of claim 1, further comprising deriving material properties of the wafer region from the extracted phase information.

3. The method of claim 2, wherein the derived material properties are related to at least one of a refractive index and a segmentation ratio, of at least one wafer layer.

4. The method of claim 1, wherein the wafer region comprises at least one metrology target cell.

5. The method of claim 1, wherein the scanning is carried out by moving a stage supporting the wafer.

6. The method of claim 1, wherein the scanning is carried out using scan mirrors of the metrology tool.

7. The method of claim 1, wherein the derived depth data is with respect to at least a vertical direction, perpendicular to the wafer region.

8. The method of claim 1, wherein the deriving is carried out with respect to one surface direction of the wafer region to provide 2D (two dimensional) profilometry information.

9. The method of claim 1, wherein the deriving is carried out with respect to one surface direction of the wafer region to provide 3D (three dimensional) surface information.

10. The method of claim 1, further comprising locating metrology targets in the wafer region using the derived depth data.

11. The method of claim 1, further comprising estimating process variation in the wafer region from the derived depth data.

12. The method of claim 1, further comprising improving overlay measurements by the metrology tool, using the derived depth data.

13. A computer program product comprising a non-transitory computer readable storage medium having computer readable program embodied therewith, the computer readable program configured to derive depth data of a scanned wafer region from phase information extracted from focus measurements of light reflected from the scanned wafer region that is received by a focus detector during scanning, wherein a degree of focus of the scanned wafer region is determined from the focus measurements and two focus signals are formed, and wherein the derived depth data is with respect to at least a vertical direction, perpendicular to the wafer region.

14. The computer program product of claim 13, wherein the computer readable program is further configured to derive material properties of the wafer region from the extracted phase information, the derived material properties being related to at least one of a refractive index and a segmentation ratio, of at least one wafer layer.

15. The computer program product of claim 13, wherein the computer readable program is further configured to provide from the derived depth data 2D profilometry information and/or 3D surface information.

16. The computer program product of claim 13, wherein the computer readable program is further configured to locate metrology targets in the wafer region using the derived depth data.

17. The computer program product of claim 13, wherein the computer readable program is further configured to estimate process variation in the wafer region from the derived depth data.

18. The computer program product of claim 13, integrated in a metrology module of a scatterometry overlay metrology tool, wherein the computer readable program is further configured to improve overlay measurements by the metrology tool, using the derived depth data.

19. A scatterometry overlay metrology tool comprising the computer program product of any one of claims 13-18.

* * * * *